United States Patent [19]
Summers et al.

[11] Patent Number: 5,883,792
[45] Date of Patent: Mar. 16, 1999

[54] PRINTED WIRING CARD END BRACKET FOR RUGGEDIZING PRINTED WIRING CARDS

[75] Inventors: Mark David Summers, Phoenix; Ronald Newell Hamilton, Mesa, both of Ariz.; Craig Bayman McIntosh, Lisle, Ill.

[73] Assignee: Motorola, Inc., Schaumburg, Ill.

[21] Appl. No.: 850,309

[22] Filed: May 5, 1997

[51] Int. Cl.$^6$ .................................................. H05K 7/15
[52] U.S. Cl. ...................... 361/825; 361/801; 361/802; 361/740; 439/59; 439/325; 439/327
[58] Field of Search .................... 361/825, 801, 361/756, 802, 740, 759, 785; 439/59, 62, 64, 325, 327, 328, 377, 636, 637

[56] References Cited

U.S. PATENT DOCUMENTS

| | | |
|---|---|---|
| 4,051,549 | 9/1977 | Fiege ........................................ 361/399 |
| 4,525,771 | 6/1985 | Hanseler et al. ......................... 361/413 |
| 4,979,075 | 12/1990 | Murphy .................................... 361/686 |
| 5,317,483 | 5/1994 | Swindler .................................. 361/801 |
| 5,398,164 | 3/1995 | Goodman et al. ....................... 361/752 |
| 5,446,619 | 8/1995 | Madsen et al. .......................... 361/695 |
| 5,694,291 | 12/1997 | Feightner ................................. 361/683 |
| 5,708,563 | 1/1998 | Cranston, III et al. .................. 361/683 |
| 5,715,146 | 2/1998 | Hoppal ..................................... 361/796 |
| 5,726,865 | 3/1998 | Webb et al. .............................. 361/801 |

*Primary Examiner*—Leo P. Picard
*Assistant Examiner*—David Foster
*Attorney, Agent, or Firm*—Frank J. Bogacz

[57] ABSTRACT

An end bracket for ruggedization of Commercial Off-The-Shelf (COTS) printed wiring cards is described. End bracket (400) has flanges (420,430) with holes for attachment of end bracket (400) to free end (250) of printed wiring card (210). End bracket (400) also has a flange (440) for attaching end bracket(400) to a fixed structure. The holes in flanges (420,430) generally form a hole pattern that matches a standard hole pattern found in free end (250) of printed wiring card (210).

7 Claims, 2 Drawing Sheets

5,883,792

PRINTED WIRING CARD END BRACKET FOR RUGGEDIZING PRINTED WIRING CARDS

RELATED INVENTIONS

The present invention is related to the following invention which is assigned to the same assignee as the present invention:

Circuit Board Bracket Clamping Apparatus and Method, Ser. No. 08/707,083, filed Sep. 3, 1996.

FIELD OF THE INVENTION

This invention relates in general to printed wiring card mounting, and in particular to printed wiring card end brackets for the rugged mounting of commercial printed wiring cards.

BACKGROUND OF THE INVENTION

As the use of computers grows, so does the breadth of applications in which they are used. Many of these applications are in harsh environments which do not lend themselves to the use of standard office computers that we find in such abundance today. However, many of these office computers are being utilized in harsh environments where their performance and reliability can be somewhat less than satisfactory. An example of a harsh environment might be a mobile application such as a truck mounted computer used for scheduling deliveries and the like. Many mobile applications exist, most of which require computers and other electronics more rugged than a standard office computer.

There are also many applications other than mobile applications which require rugged computers. One example is a machine shop, where large machinery can cause constant vibrations detrimental to computers. Military applications also exist which require rugged computers. As the government drives suppliers to utilize off the shelf equipment to the greatest extent possible, standard personal computers are being used in more and more military applications.

There are many types of failures to which a computer can succumb when subjected to a harsh environment. One such type of failure relates to add-in cards. Because these cards are designed to be easily removed, if care is not taken to secure them well, they can come loose, or even vibrate to the point of breakage. Some cards, designed to be add-in cards for computers, are more rugged than others. As will be discussed herein, the add-in cards which currently contain rugged features adapted to harsh environments are not those with the most common form factors and those that are most readily available. Specifically, add-in cards originally designed for industrial applications, especially those applications requiring rack mounted equipment, are most easily adapted to harsh environments.

What is being used in harsh environments today, however, rather than rack mounted industrial grade equipment, is a variation of the standard personal computer with possibly some slight modifications. The users of rugged computers have been driven to the use of this widely available platform because of the ready availability and low cost of software and peripherals including add-in cards. These add-in cards for standard personal computers are hereinafter referred to as Commercial Off The Shelf (COTS) printed wiring cards. COTS printed wiring cards, although readily available and inexpensive, are many times not suitable for rugged use. The majority of the COTS add-in cards are printed wiring cards have inherent problems for packaging in harsh environments. If COTS printed wiring cards are subjected to excessive vibration a multitude of problems can occur. Connectors can break, solder joints can crack and in the extreme, entire boards can crack.

Hence, there is a need for the ability to make COTS printed wiring cards more rugged, thereby enabling their use in harsh environments without adding significant expense.

BRIEF DESCRIPTION OF THE DRAWINGS

The invention is pointed out with particularity in the appended claims. However, other features of the invention will become more apparent and the invention will be best understood by referring to the following detailed description in conjunction with the accompanying drawings in which:

DETAILED DESCRIPTION OF THE INVENTION

Figure 1:
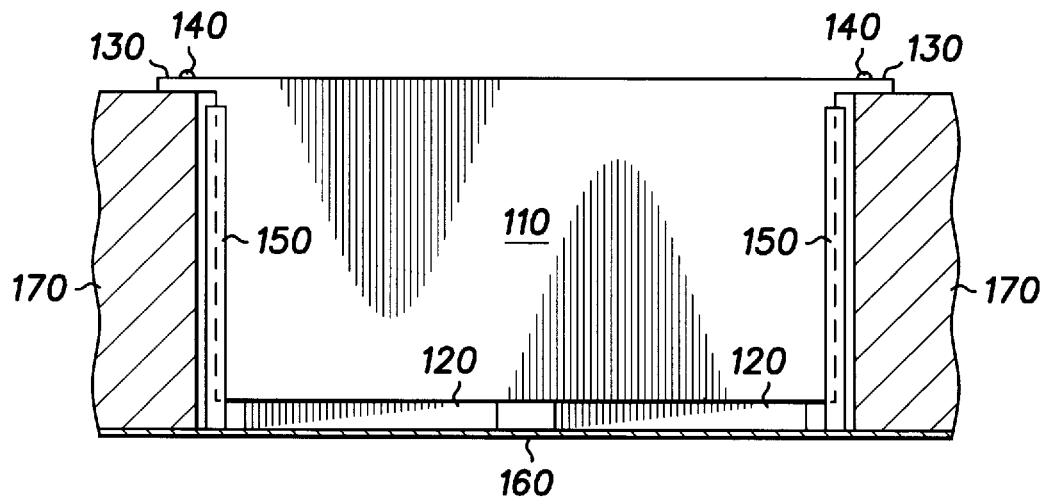
FIG. 1 shows a layout of a prior art VME card adapted for use in harsh environments.

As mentioned previously, there exists a family of computer cards other than COTS printed wiring cards which lend themselves to rugged use in harsh environments. One such computer card is shown in FIG. 1. FIG. 1 shows a VME card, prior art, as it would look mounted within a computer. As can be seen in FIG. 1, VME card 110 has connectors 120. VME cards can have any number of connectors 120, but are generally limited to between one and three. Connectors 120 which are connected to VME card 110 mate with connectors (not shown) which are, in turn, rigidly attached to a motherboard 160. VME card 110 is held in place on two sides by edge guides 150. Edge guides 150 are rigidly attached to motherboard 160 such that when VME card 110 is being installed, two edges of the card slide in edge guides 150 as connectors 120 mate with the receiving connectors. VME card 110 has, at the end opposite the connectors 120, a flange 130. This flange 130, with a hole therein, is used to secure VME card 110 to a fixed structure 170 through the use of screw 140. As can be seen from FIG. 1, the VME card 110 is very well supported on three sides and is thus quite suitable for use in harsh environments.

The VME card discussed in the previous paragraph survives well in harsh environments because it is so well mechanically supported. One problem with the VME card, however, is its form factor in general. Computers that receive VME cards are considerably more expensive than standard personal computers. In addition, VME cards are not as readily available as COTS printed wiring cards. Because they are not as readily available, VME cards also tend to be more expensive.

Figure 2:
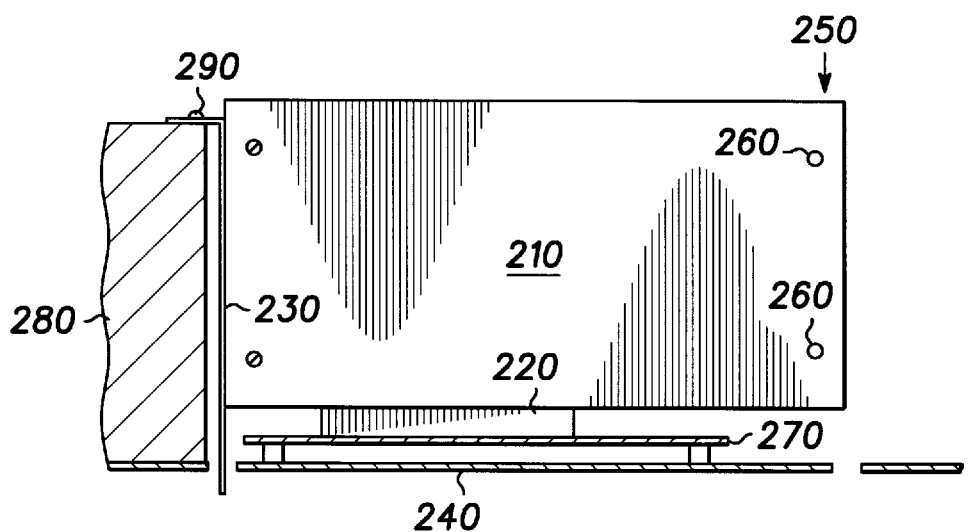
FIG. 2 shows a layout of a prior art printed wiring card mounted in a personal computer.

Referring now to FIG. 2, a COTS printed wiring card, prior art, is shown as it would appear when mounted in a standard personal computer. Printed wiring card 210 is shown generically as a rectangle with a single connector 220 at its base. The actual form factor of the printed wiring card 210 can vary based on the type of standard to which it adheres. Possible standards are Industry Standard Architecture (ISA), Extended Industry Standard Architecture (EISA), Peripheral Component Interconnect (PCI), and Video Electronics Standard Association (VESA). Along with form factor variations, the number of connectors 220 can also vary. The printed wiring card 210 of FIG. 2 is meant to encompass all of these possible variations. When printed wiring card 210 is installed in a computer, connector 220 is received by a mating connector (not shown) which is, in turn, rigidly attached to motherboard 270. Motherboard 270 is generally attached to chassis floor 240 in such a way that they share a common electrical ground. Printed wiring card 210 has connected to it on one end, standard printed wiring card bracket 230. Standard printed wiring card bracket 230 is well known in the art and will look very familiar to anyone who has added a printed wiring card to a personal computer. The top end of standard printed wiring card bracket 230 generally has a hole or a slot to receive a screw 290 thereby attaching it to a fixed structure 280. The bottom end of standard printed wiring card bracket 230 is generally received by a hole in the chassis floor 240. Historically, this has served an alignment function and has not provided mechanical support.

The totality of mechanical support for printed wiring card 210 then, consists of a point at the top of standard printed wiring card bracket 230 where an attachment is made to a fixed structure 280, and the edge connector 220 at the base of printed wiring card 210. It will be readily apparent to one skilled in the art that this means of mechanical support is grossly inadequate for use in harsh environments. In particular, vibration encountered in a harsh environment could easily unseat the card because printed wiring card 210 has one entire free end generally designated 250 which is provided no support. Free end 250 has holes designated 260. Printed wiring card 210 as shown in FIG. 2 shows two such holes 260 at free end 250, but the actual number of holes is not limited to two. Holes 260 on the types of printed wiring cards of interest to this invention generally form a standard hole pattern common across all printed wiring cards of a given type.

Figure 3:
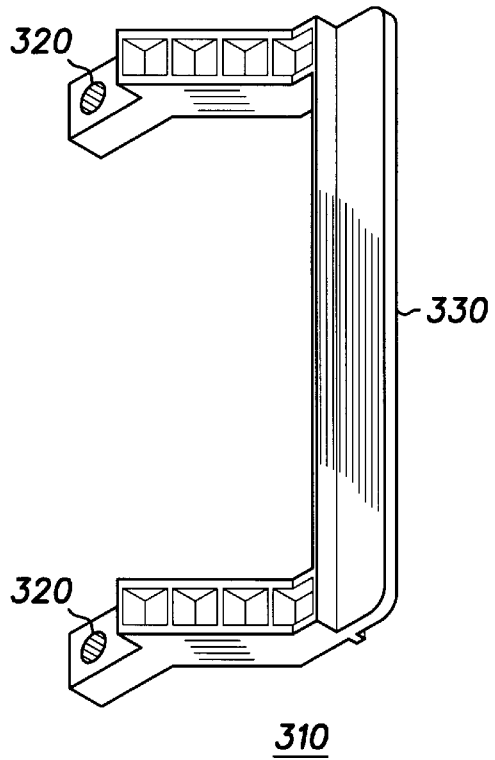
FIG. 3 shows a layout of a prior art standard card guide.

Although holes 260 often go unused, there is a standard application for them. This application is shown in FIG. 3. FIG. 3 shows a standard card guide, well known in the art, generally designated 310. Standard card guide 310 has holes 320 which form a pattern that matches the hole pattern formed by holes 260 on free end 250 of printed wiring card 210. Standard card guide 310 can be attached to printed wiring card 210 by fastening holes 320 to holes 260 with fasteners well known in the art. When standard card guide 310 is fastened to free end 250 then the card guide edge 330 becomes the end most portion of printed wiring card 210. Card guide edge 330 is formed to be long and narrow so that it may be received in a slot which forms a part of the computer case. Standard card guide 310 is generally made of plastic. The well known configuration of printed wiring card 210 with standard card guide 310 attached, when properly installed in a computer, provides for more stability than that which is provided by printed wiring card 210 alone. However, because standard card guide 310 allows free movement of free end 250 along the direction of the card guide edge 330, this configuration remains inadequate for harsh environments. Because free end 250 is free to move in the direction of card guide edge 330, it can be seen that if put to service in an environment with heavy vibration, printed wiring card 210 can have a portion of edge connector 220 become unseated. Standard card guide 310 exists for each of the previously mentioned types of COTS printed wiring cards wherein the hole spacing of holes 320 matches the hole spacing of holes 260 for each type of card guide and printed wiring card.

It can be seen then, that there is a need to secure the free end of a commercial off the shelf printed wiring card for use in a computer installed in a harsh environment. The invention described herein provides for securing the free end of a COTS printed wiring card in a cost effective manner resulting in a robust solution to this existing problem.

Figure 4:
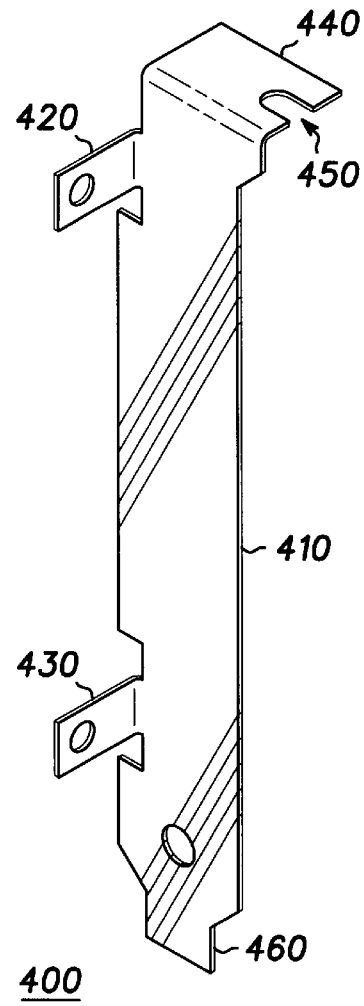
FIG. 4 shows an isometric view of an end bracket for use in ruggedizing COTS printed wiring cards in accordance with one aspect of the present invention.

Referring now to FIG. 4, an end bracket 400 is shown. End bracket 400 illustrates one embodiment of the present invention. End bracket 400 has a body 410 which when installed, is a substantially vertical member. In the preferred embodiment shown in FIG. 4, end bracket 400 has a top flange 420 and bottom flange 430, alternatively termed printed wiring card flanges, which are used for attaching end bracket 400 to printed wiring card 210 at holes 260. Printed wiring card flanges 420 and 430 are, as shown in FIG. 4, separate and distinct flanges. However, an alternate embodiment of the present invention has flanges 420 and 430 combined as a single flange. Conversely, if more than two holes 260 exist on printed wiring card 210, the printed wiring card flanges of end bracket 400 can grow in number while still practicing the present invention. For ease of explanation, the side of end bracket 400 which faces printed wiring card 210 is termed the front side. Likewise, the side of end bracket 400 which faces printed wiring card 210 is termed the back side. Extending from the back side is a substantially horizontal flange, alternatively termed the fixed structure flange, generally designated 440. The purpose of fixed structure flange 440 is to provide attachment means to a fixed structure as will be discussed below. Part of the attachment means shown in the preferred embodiment of FIG. 4 is a slot 450 in fixed structure flange 440. Slot 450, in an alternate embodiment of the present invention, could be a hole or a number of holes. In addition, although the preferred embodiment shows a single fixed structure flange 440, multiple flanges for providing multiple attachments points are contemplated. For ease of discussion, end bracket 400 is termed to have a top section and a bottom section. These are general terms and there exists no fixed demarcation line between top and bottom. End bracket 400 has a bottom section 460 which, in the preferred embodiment is adapted to be received and then rigidly attached to a fixed structure.

Holes 260 represent an attachment means for attaching end bracket 400 to free end 250. Alternate embodiments of the present invention contemplate different possible method for attaching end bracket 400 to free end 250. Flanges 420 and 430 as shown, mate with one side of printed wiring card 210 at free end 250. An alternate embodiment of the present invention contemplates multiple flanges such that a flange can be presented on either side of printed wiring card 210, or both sides of printed wiring card 210 for attaching. In addition, rather than simply a hole in flanges 420 and 430 which is designed to receive a screw or other fastener, an integral screw or other protrusion is contemplated.

The preferred embodiment of end bracket 400 as shown in FIG. 4 has all flanges oriented such that end bracket 400 can be stamped from a single piece of stock. Stamping from a single piece of stock is an inexpensive operation and so is desirable to keep costs down. The ability to stamp end bracket 400 from a single piece of stock is not a requirement of the present invention, and in fact, alternate embodiments contemplate other methods of fabrication.

Figure 5:
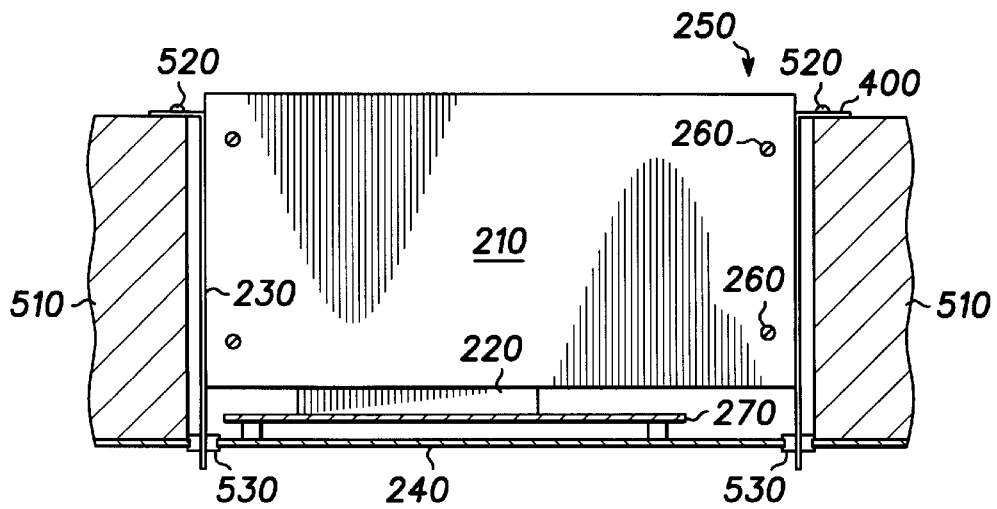
FIG. 5 shows a layout of a COTS printed wiring card with an end bracket installed in accordance with one aspect of the present invention.

FIG. 5 shows the preferred embodiment of end bracket 400 attached to free end 250 of printed wiring card 210 for the purpose of attaching free end 250 to a rigid structure designated 510 in FIG. 5. Screw 520 is shown attaching end bracket 400 to fixed structure 510. The bottom section of end bracket 400 is shown as having been received by a bracket attachment point 530 which rigidly attaches end bracket 400 to chassis floor 240. Along with increased mechanical support, this rigid attachment to chassis floor 240 also can provide a more robust ground connection, thereby improving the electrical characteristics.

FIG. 5 graphically demonstrates the utility of the present invention as embodied in end bracket 400. Printed wiring card 210 which heretofore has not been suitable for use in a harsh environment, now has a sufficient number of attachment points to render it suitable for use in a harsh environment. Printed wiring card 210 is now attached at standard end bracket 230, edge connector 220, and at end bracket 400, making it resemble the much more costly and somewhat incompatible rugged computer cards discussed previously. Through the use of the present invention as embodied by end bracket 400, an inexpensive and readily available printed wiring card can be used more reliably in a harsh environment, thereby satisfying an existing need in a very competitive marketplace.

The present invention, in many of its attendant advantages will be understood from the foregoing description and it will be apparent that various changes may be made in the form, construction, and the arrangement of the parts, without departing from the spirit and scope of the invention, or sacrificing all of their material advantages, the form herein being merely a preferred or exemplary embodiment thereof.

Accordingly, it is intended that the appended claims cover all modifications of the invention which fall within the true spirit and scope of the invention.

What is claimed is:

1. An end bracket for securing a free end of a printed wiring card, said free end including a free end hole pattern, comprising:

a substantially vertical member including a top section, a bottom section, a front side, and a back side, thereby forming a front side of said top section, a front side of said bottom section, a back side of said top section, and a back side of said bottom section;

a substantially horizontal flange extending from said back side of said top section of said substantially vertical member, said substantially horizontal flange being adapted to rigidly attach to a fixed structure;

a top flange extending from said front side of said top section, said top flange including a top hole therein, said top hole including a top hole orientation;

a bottom flange extending from said front side of said bottom section, said bottom flange including a bottom hole therein, said bottom hole including a bottom hole orientation, said top hole orientation and said bottom hole orientation forming an end bracket hole pattern, wherein said end bracket hole pattern is adapted to mate with said free end hole pattern of said free end of said printed wiring card;

said substantially vertical member including an aperture located on said bottom section, said aperture being substantially orthogonal to said top hole and to said bottom hole; and a bracket attachment point affixed to said aperture, said bracket attachment point for rigidly attaching said bottom section of said substantially vertical member to said fixed structure.

2. The end bracket of claim 1 wherein said printed wiring card includes a PCI card.

3. The end bracket of claim 1 wherein said printed wiring card includes a ISA card.

4. The end bracket of claim 1 wherein said printed wiring card includes a EISA card.

5. The end bracket of claim 1 wherein said printed wiring card includes a VESA card.

6. The end bracket of claim 1 wherein said substantially horizontal flange includes a hole.

7. The end bracket of claim 1 wherein said substantially horizontal flange includes a slot.

\* \* \* \* \*